US008108450B2

(12) United States Patent
Cong et al.

(10) Patent No.: US 8,108,450 B2
(45) Date of Patent: *Jan. 31, 2012

(54) AGGREGATION OF WRITE TRAFFIC TO A DATA STORE

(75) Inventors: Shi Cong, Issaquah, WA (US); Scott Brender, Kirkland, WA (US); Karan Mehra, Sammamish, WA (US); Darren G. Moss, Redmond, WA (US); William R. Tipton, Seattle, WA (US); Surendra Verma, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/087,927

(22) Filed: Apr. 15, 2011

(65) Prior Publication Data
US 2011/0197016 A1 Aug. 11, 2011

Related U.S. Application Data

(63) Continuation of application No. 12/234,411, filed on Sep. 19, 2008, now Pat. No. 7,953,774.

(51) Int. Cl.
*G06F 17/30* (2006.01)
(52) U.S. Cl. ......... 707/823; 707/824; 711/104; 711/112
(58) Field of Classification Search .................. 711/104, 711/112; 707/999.107, 999.205, 823, 824
See application file for complete search history.

(56) References Cited

U.S. PATENT DOCUMENTS

| 5,297,258 | A | 3/1994 | Hale et al. |
|---|---|---|---|
| 5,454,098 | A | 9/1995 | Pisello et al. |
| 5,551,002 | A | 8/1996 | Rosich et al. |
| 6,122,685 | A | 9/2000 | Bachmat |
| 6,148,368 | A | 11/2000 | DeKoning |
| 6,189,071 | B1 | 2/2001 | Bachmat |
| 6,516,380 | B2 | 2/2003 | Kenchammana-Hoskote et al. |
| 6,636,942 | B2 | 10/2003 | Greco |
| 6,918,022 | B2 | 7/2005 | Li et al. |
| 6,996,660 | B1 | 2/2006 | Moore et al. |
| 7,062,675 | B1 | 6/2006 | Kemeny et al. |
| 2007/0043787 | A1 | 2/2007 | Cannon |
| 2007/0207800 | A1 | 9/2007 | Daley et al. |

(Continued)

OTHER PUBLICATIONS

PCT/US2009/055198, International Search Report and the Written Opinion of the International Searching Authority, mailed Feb. 26, 2010, 11 pages.

(Continued)

*Primary Examiner* — Leslie Wong
(74) *Attorney, Agent, or Firm* — Capitol City TechLaw; Richard C. Irving

(57) ABSTRACT

A method and a processing device are provided for sequentially aggregating data to a write log included in a volume of a random-access medium. When data of a received write request is determined to be suitable for sequentially aggregating to a write log, the data may be written to the write log and a remapping tree, for mapping originally intended destinations on the random-access medium to one or more corresponding entries in the write log, may be maintained and updated. At time periods, a checkpoint may be written to the write log. The checkpoint may include information describing entries of the write log. One or more of the checkpoints may be used to recover the write log, at least partially, after a dirty shutdown. Entries of the write log may be drained to respective originally intended destinations upon an occurrence of one of a number of conditions.

20 Claims, 13 Drawing Sheets

U.S. PATENT DOCUMENTS

2009/0150599 A1* 6/2009 Bennett .................... 711/103
2009/0287890 A1 11/2009 Bolosky

OTHER PUBLICATIONS

Nieplocha et al., "ARMCI: A Portable Aggregate Remote Memory Copy Interface", retrieved at <<http://www.emsl.pnl.gov/docs/parsoft/armci/publications/armci1-1.pdf>>, Version 1.1, Oct. 30, 2000, pp. 1-11.

Brian S. Mitchell, "Managing Cache Coherence in Multiprocessor Computer Systems", retrieved at <<http://www. cs.drexel.edu/~bmitchel/research/CacheCoherence/CacheCoherence.html>>, Jul. 10, 2008, pp. 1-26.

Dove et al., "Windows XP for Embedded Applications", retrieved at <<http://www.automation.com/resources-tools/ articles-white-papers/pc-based-control/windows-xp-for-embedded-applications>>, Jul. 10, 2008, pp. 1-3.

"Novell", retrieved at <<www.novell.com/documentation/nw6p/index.html?page=/documentation/nw6p/nss_enu/data/h5grftdf.html>>, Jul. 10, 2008, pp. 1-7.

* cited by examiner

AGGREGATION OF WRITE TRAFFIC TO A DATA STORE

This application is a continuation application of co-pending U.S. patent application Ser. No. 12/234,411, filed in the U.S. Patent and Trademark Office on Sep. 19, 2008 and entitled "Aggregation of Write Traffic to a Data Store."

BACKGROUND

Data stores, such as, for example, disk drives and flash-based storage, are most efficient when writing data sequentially and are very inefficient when writing randomly scattered data. In addition, disk drives are most efficient when reading sequential data and are very inefficient when reading randomly scattered data. A typical modern disk drive is capable of moving approximately 700 kilobytes (KB) of data in an amount of time taken for the disk drive to seek an arbitrary location on a disk. As technology advances, disk drives may be capable of moving larger amounts of data during a same time period.

Most data transfers are much smaller than 700 KB. As a result, disk drives may spend a significant amount of time seeking locations on disks during non-idle time periods.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

A processing device and a machine-implemented method may be provided for sequentially aggregating data, originally intended to be written to a volume of a random access medium, to a write log. The processing device may determine whether the data is suitable for writing to the write log. If the data is determined to be suitable for writing to the write log, then the processing device may sequentially aggregate, or write, the data to the write log. Otherwise, the data may be written to an originally intended destination. Entries of the write log may be drained to originally intended destinations upon an occurrence of at least one of a number of conditions. The conditions may include, but not be limited to: the write log being in a state in which new log entries are not permitted; an absence of input or output activity with respect to the random access medium upon which the write log resides; the write log being at the least a first predetermined amount full; the write log being at least a second predetermined amount full regardless of the input or output activity of the random access medium; and a remapping tree being larger than a predetermined size. The remapping tree may map an address range of a random access medium to one or more entries of the write log.

In some embodiments, respective checkpoints may be written to the write log at time intervals. Each of the respective checkpoints may include information describing contents of the write log, such that the remapping tree may be rebuilt after a dirty shutdown. The information included in the respective checkpoints may be obtained from nodes of the remapping tree.

DRAWINGS

In order to describe the manner in which the above-recited and other advantages and features can be obtained, a more particular description is described below and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

DETAILED DESCRIPTION

Figure 1:
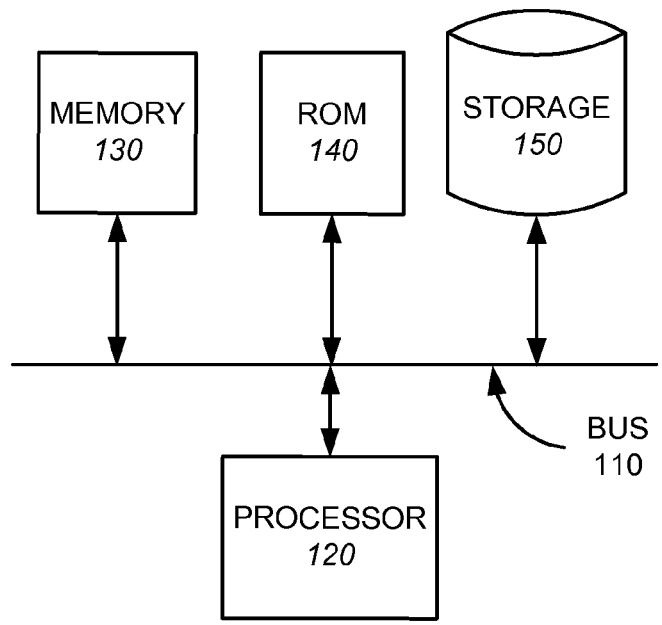
FIG. 1 illustrates a functional block diagram of an exemplary processing device, which may be used to implement embodiments consistent with the subject matter of this disclosure.

Embodiments are discussed in detail below. While specific implementations are discussed, it is to be understood that this is done for illustration purposes only. A person skilled in the relevant art will recognize that other components and configurations may be used without parting from the spirit and scope of the subject matter of this disclosure.

Overview

A method and a system are provided for receiving a request to write to a random access medium, such as, for example, a disk, flash-based storage, or other random access medium. The request to write may then be analyzed to determine whether the request is suitable for sequentially aggregating to a write log. The request may be determined to be suitable for sequentially aggregating to the write log when the request is for writing less than a predetermined amount of data to the random access medium. In some embodiments a request for writing, to the random access medium, an adjustable threshold amount of data, which may be less than 700 KB, may be determined to be suitable for sequentially aggregating to the write log.

The write log may reside within a same volume of the random access medium as an originally intended destination, a different volume of the random access medium as the originally intended destination, or a different volume of a different random access medium as the originally intended destination. The write log may include a number of entries, each having metadata describing a respective entry and corresponding payload data. When a request to write data to the random access medium is determined to be suitable for writing to the write log, the data may be added to an end of the write log. A remapping tree may map locations of the random access medium, outside of the write log, to corresponding entries of the write log and vice versa.

Draining is a process by which entries in the write log are moved to intended destinations of the volume of the random access medium. The write log may be drained to the intended locations of the random access medium under a number of conditions. For example, in some embodiments, the conditions may include: the write log being in a state in which new entries to the write log are not permitted; the write log being more than a first predetermined amount full; no input/output activity with respect to the random access medium and the write log being more than a second predetermined amount full, where the second predetermined amount is less than the first predetermined amount; and the remapping tree being larger than a third predetermined size. During draining, adjacent writes may be merged into a single drain write and drain writes may be ordered to minimize seek time.

In some embodiments, a checkpoint may be written to the write log at adjustable time intervals. A checkpoint may include information summarizing contents of the write log. A dirty shutdown may be an unexpected shutdown or system failure. After a dirty shutdown or a normal shutdown of a system, information included in a last checkpoint written to the write log may be used to recover from the dirty shutdown or the normal shutdown by rebuilding a remapping tree.

Exemplary Processing Device

FIG. 1 is a functional block diagram of an exemplary processing device 100, which may be used to implement embodiments consistent with the subject matter of this disclosure. Processing device 100 may be a desktop personal computer (PC), a notebook or laptop PC, a server, or other processing device. Processing device 100 may include a bus 110, a memory 130, a read only memory (ROM) 140, a processor 120, and a storage device 150. Bus 110 may permit communication among components of processing device 100.

Processor 120 may include at least one conventional processor or microprocessor that interprets and executes instructions. Memory 130 may be a random access memory (RAM) or another type of dynamic storage device that stores information and instructions for execution by processor 120. Memory 130 may store temporary variables or other intermediate information used during execution of instructions by processor 120. ROM 140 may include a conventional ROM device or another type of static storage device that stores static information and instructions for processor 120. Storage device 150 may include a hard disk and corresponding drive, a flash-based storage device, or other type of random access data storage device or medium for storing data and/or instructions for processor 120.

Processing device 100 may perform functions in response to processor 120 executing sequences of instructions contained in a tangible machine-readable medium, such as, for example, memory 130, ROM 140, storage device 150 or other medium. Such instructions may be read into memory 130 from another machine-readable medium or from a separate device via a communication interface (not shown).

Write Log

Figure 2:
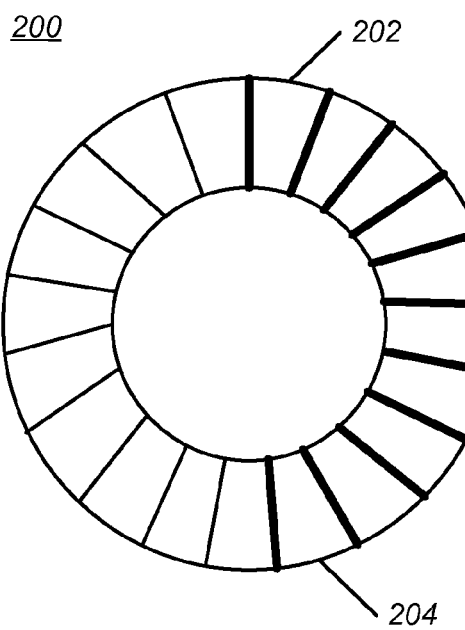
FIG. 2 illustrates exemplary circular storage for storing a write log in embodiments consistent with the subject matter of this disclosure.

In embodiments consistent with the subject matter of this disclosure, a write log, for sequentially aggregating writes intended for a random access medium, may be a circular storage area within a random access medium, such as, for example, a disk or other random access medium. FIG. 2 illustrates an exemplary write log 200. Write log 200 may include multiple entries, including a starting entry 202 and an ending entry 204. Starting entry 202 may be an oldest entry of write log 200, while ending entry 204 may be a newest entry of write log 200. That is, new entries may be appended to write log 200 after ending entry 204, and ending entry 204 may be updated to correspond to a newest of the appended entries.

Figure 3:
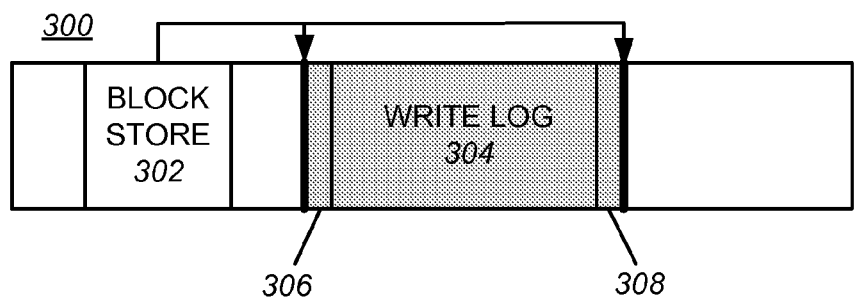
FIG. 3 illustrates an exemplary write log in a volume of a random-access medium.

FIG. 3 illustrates exemplary structures which may be stored on a random access medium 300 consistent with the subject matter of this disclosure. Random access medium 300 may include a block store structure 302 and a write log 304 recorded on random access medium 300. Block store structure 302 may include information with respect to an area of random access medium 300 which is not to be used by the file system. The area may correspond to an area reserved for write log 304 for sequentially aggregating data intended for a volume of random access medium 300. In some embodiments, write log 304 may be included within a different volume of random access medium 300 than an originally intended destination, or a different volume of a different random access medium.

Write log 304 may include a first control area 306 and a second control area 308, which may be located at a beginning and an end, respectively, of write log 304. The first and the second control area may include information about write log 304 including, but not limited to, information about a starting entry of write log 304 and information about a physical end of write log 304. In some embodiments, the information about a starting entry may include a starting log sequence number (LSN) of write log 304, and the information about a physical end of write log 304 may include a wrapping LSN. Some embodiments may include information, such as a pointer or other information regarding a location of a last checkpoint within the first control area 306 and the second control area 308.

Each entry of write log 304 corresponds to a LSN. A LSN may include a wrap count portion and an offset portion. The wrap count portion may be a number of occurrences of wrapping back to a physical beginning of write log 304. The offset portion may be an offset in sectors or some other unit of measurement, from a physical beginning of write log 304. A wrapping LSN may be a LSN at which wrapping to a physical beginning of write log 304 and incrementing of the wrap count may occur. For example, if the wrapping LSN is <wrap count>0.400, where 400 is an offset from a physical beginning of write log 304, then when a current LSN has reached, for example, 2.400, then wrapping to a physical beginning of write log 304 may occur and the current LSN may become 3.0.

Figure 4:
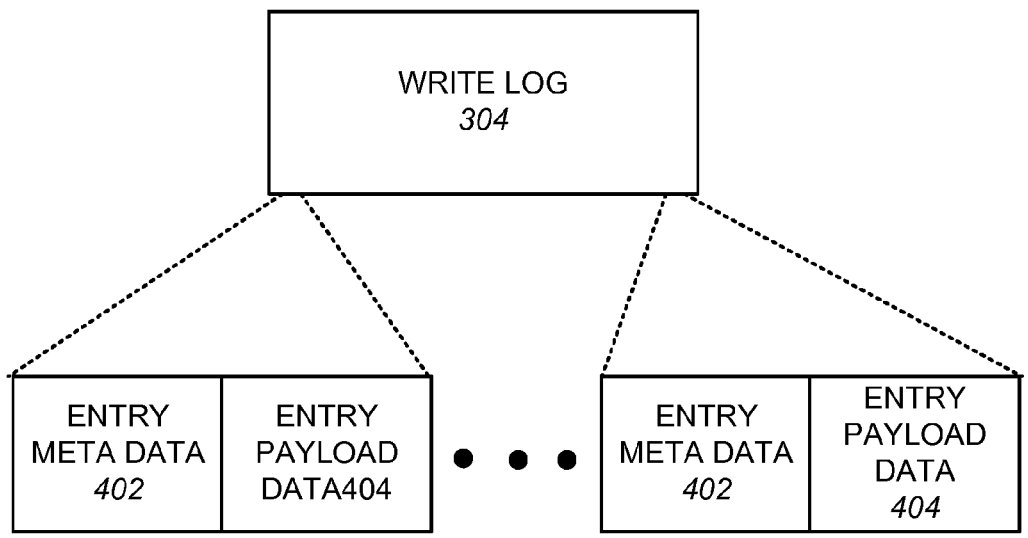
FIG. 4 illustrates a more detailed view of the exemplary write log shown in FIG. 3.

Write log 304 may include a number of entries. As shown in FIG. 4, each of the entries may include entry metadata 402 and entry payload data 404. Entry metadata 402 may include information about a respective entry. For example, entry metadata 402 may include information about a size of the respective entry, and a logical block address (LBA) of an intended destination in a volume of random access medium 300, as well as different or other information. Further, entry metadata 402 may include a checksum or other data indicating whether the respective entry is valid. In some embodiments, entry metadata 402 and entry payload data 404 may be sector aligned.

A remapping tree may be maintained in dynamic storage, such as, for example, memory or RAM. The remapping tree may map intended destinations, such as, for example, LBAs in a volume of a random access medium, to entries in a write log and vice versa. The remapping tree may be structured as an AVL tree. An AVL tree is a self-balancing binary search tree in which heights of child subtrees of any node may differ by no more than one.

Figure 5:
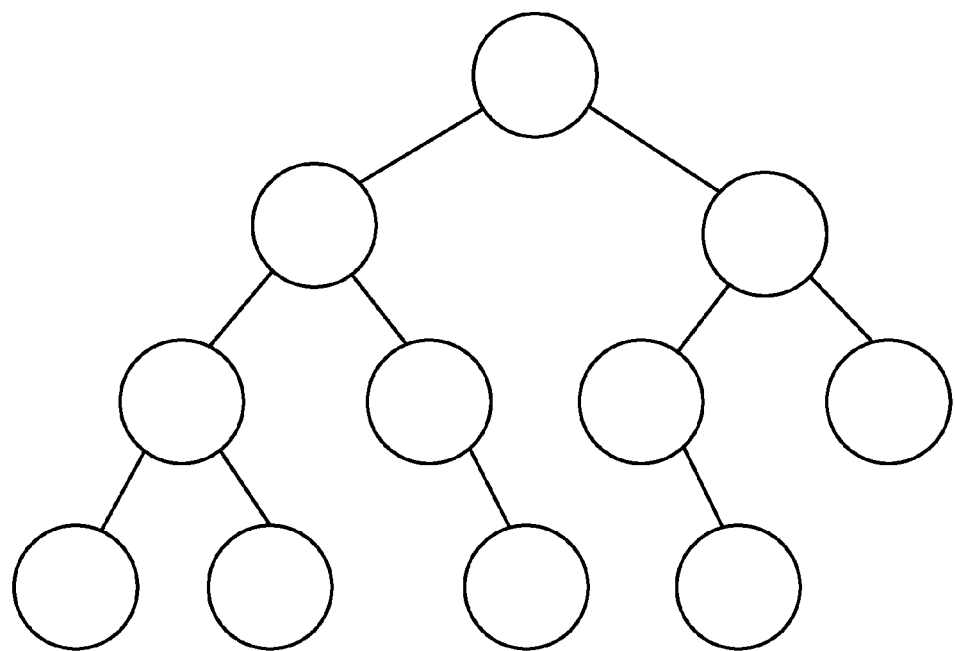
FIG. 5 illustrates and exemplary structure of a remapping tree consistent with the subject matter of this disclosure.

FIG. 5 illustrates an exemplary remapping tree. As one can see in the exemplary remapping tree, heights of all child subtrees differ by no more than one from other child subtrees beginning on a same level. Of course, in other embodiments, a remapping tree may be a different data structure. Each node of the remapping tree may include information, such as, for example, a LBA of an intended destination, a corresponding LSN in a write log, information describing a type of entry, as well as other or different information.

If a LBA of a random access medium is written to twice, the second write invalidates the first write. Similarly, if the first write to the LBA is redirected to a write log and the second write to the LBA is also redirected to the write log, an entry in the write log corresponding to the first write may be superseded by an entry in the write log corresponding to the second write. This may be referred to as an internal overwrite.

However, if the first write is redirected to the write log while the second write is written directly to the LBA in the volume of the random access medium, the entry of the write log corresponding to the first write is no longer valid. An invalidation record may be appended to the write log indicating that the entry corresponding to the first write is no longer valid.

Figure 6:
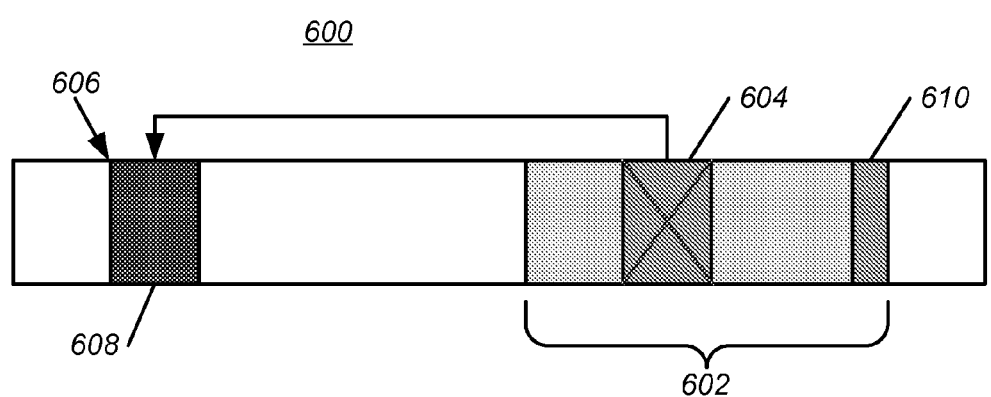
FIG. 6 illustrates an effect of overwriting data stored on a ransom access medium, which is mapped to an entry of a write log.

FIG. 6 illustrates a volume 600 of a random access medium. Write log 602 may be included in volume 600. A first write may be redirected to write log 602 and recorded as entry 604 of write log 602. The first write may have an intended destination corresponding to destination 608 in volume 600. A second write 606 may be written directly to destination 608. Thus, entry 604 may now be invalid. Invalidation record 610 may be appended to write log 602 to indicate that entry 604 is now invalid. Later, when the entries of write log 602 are to be drained to respective intended destinations in volume 600, entry 604 may not be drained to destination 608 because doing so would overwrite destination 608 and destroy contents of destination 608. Instead, entry 604 may simply be discarded.

Exemplary Processing

Figure 7:
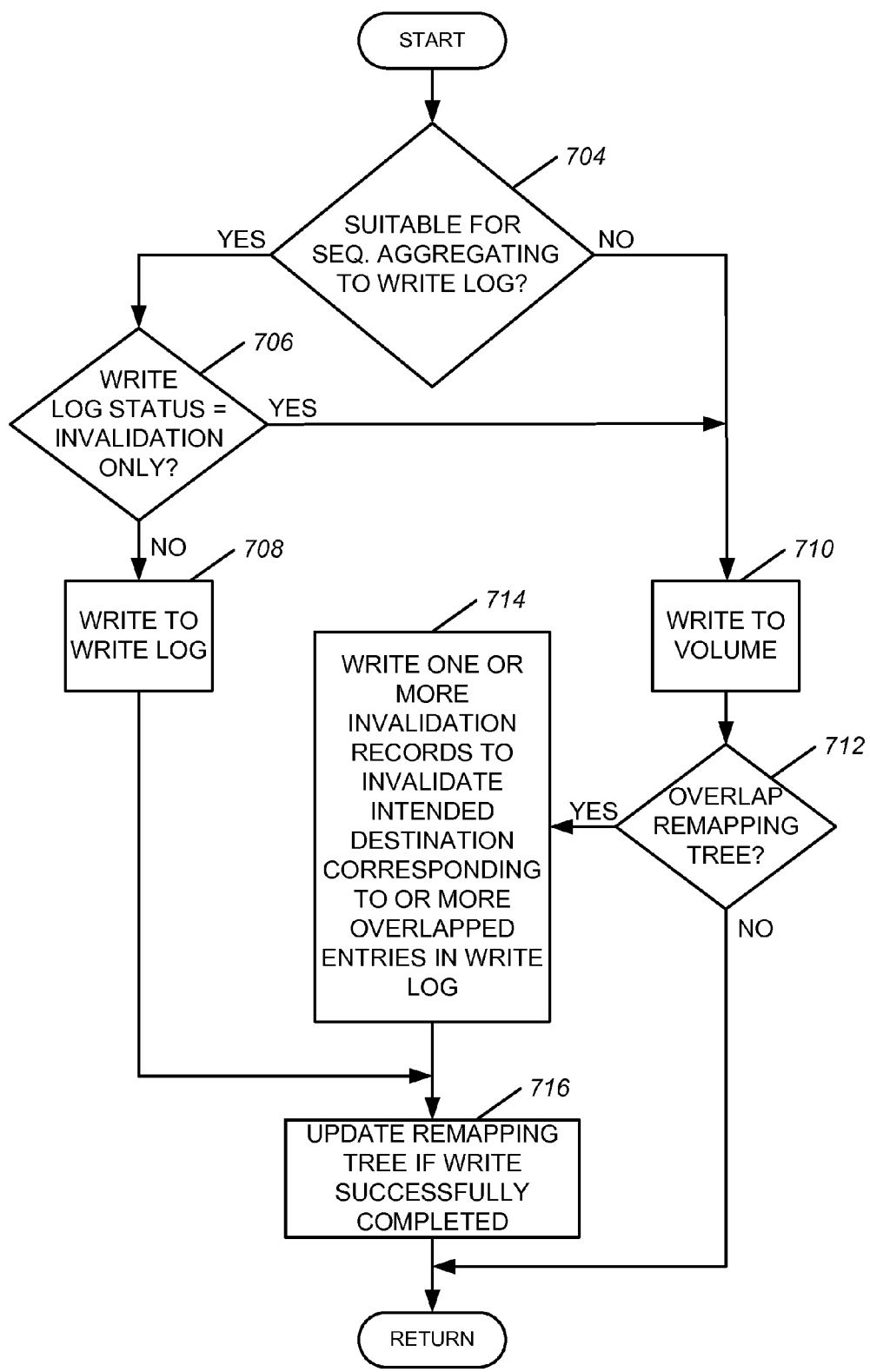
FIGS. 7 and 8 are flowcharts illustrating exemplary processes for processing a received write request for writing to a random access medium, a write completed indication with respect to writing to the write log.

FIG. 7 is a flowchart illustrating an exemplary process for determining whether a received write request is suitable for sequentially aggregating to a write log, and, if so, redirecting the write request to the write log. The process may begin with a processing device determining whether the received write request is suitable for sequentially aggregating to the write log (act 704).

Figure 8:
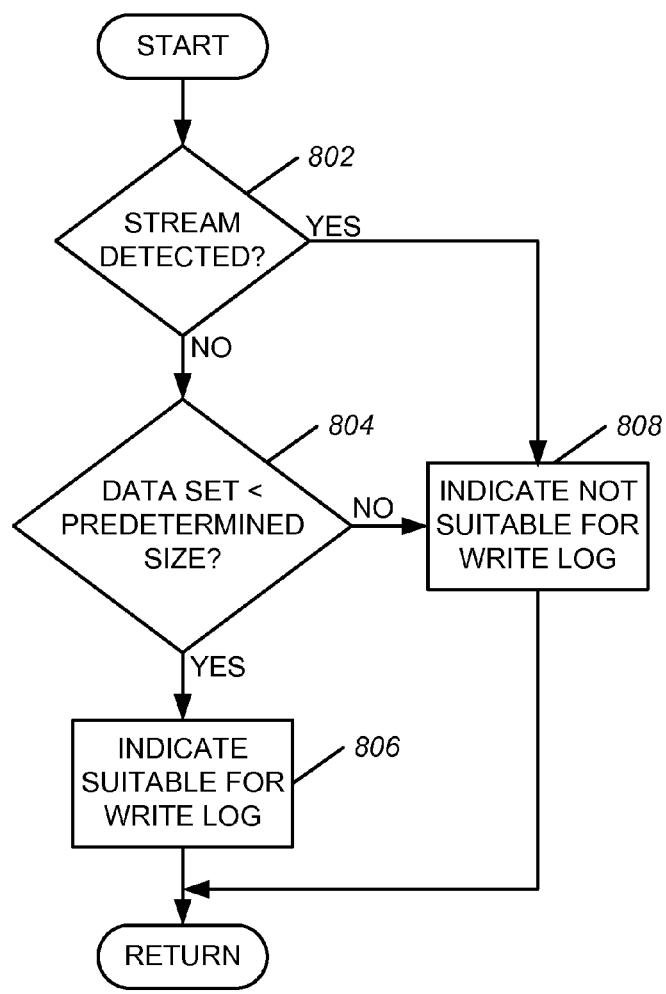

FIG. 8 is a flowchart illustrating an exemplary process for performing act 704 of FIG. 7. The process may begin with the processing device determining whether the received write request is for a stream (act 802; FIG. 8). The processing device may detect a stream by monitoring volume offsets of read and write requests to determine whether read and write patterns are sequential. If the read and write patterns are determined to be sequential, the processing device has detected a stream and may not direct the stream to the write log. If a stream is detected, the processing device may indicate that the received write request is not suitable for redirecting to the write log (act 808) and the process may be completed.

If, during act 802, the processing device determines that the received write request is not for a stream, then the processing device may determine whether data, or a data set, to be written, is less than a predetermined size, such as, 700 KB, or another size (act 804). If the data, or the data set, is not less than the predetermined size, then the processing device may indicate that the write request is not suitable for redirecting to the write log (act 808) and the process may be completed.

If, during act 804, the processing device determines that the data, or the data set, to be written, is less than the predetermined size, then the processing device may indicate that the write request is suitable for redirecting to the write log (act 806). The process may then be completed.

Returning to FIG. 7, if during act 704 the processing device determines that the write request is suitable for sequentially aggregating to the write log, then the processing device may determine whether a status of the write log is invalidation only, indicating that only invalidation records may be written to the write log (act 706). If the status of the write log is not invalidation only, then the processing device may write the data, or the data set, as an entry to the write log (act 708.

If, the write to the write log completes successfully the processing device may update a remapping tree for mapping intended destinations in a volume of a random access medium to entries in the write log (act 716).

If, during act 704, the processing device determines that the data, or the data set, to be written, is not suitable for sequentially aggregating to the write log, then the data, or the data set, may be written to an intended destination in the volume of the random access medium (act 710). The processing device may then determine whether any of the LBAs of the intended destination correspond to one or more entries of the write log by referencing the remapping tree (act 712). If any of the LBAs of the intended destination corresponds to one or more entries of the write log, then one or more invalidation records may be appended to the write log to indicate invalidation of the intended destination corresponding to the one or more entries of the write log (act 714).

Figure 9:
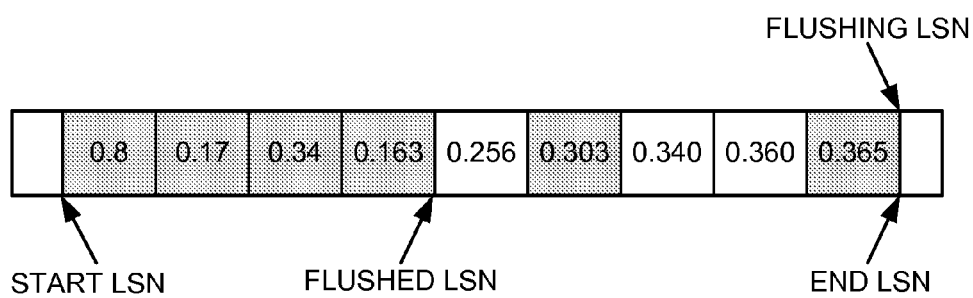
FIG. 9 illustrates exemplary entries in a write log and flushing of the entries.

Writes to the write log may be completed out of order. For example, FIG. 9 shows entries of a write log and a respective LSN for each of the entries. A shaded entry corresponds to an entry not having a pending write (i.e., respective write to the write log for the entry has been completed). An unshaded entry corresponds to an entry having a pending write. Thus, according to FIG. 9, the entry indicated by LSN 0.256 has a write pending.

A flushed LSN is a LSN corresponding to an entry of the write log, such that all entries of the write log preceding the corresponding entry have no pending writes. Start LSN is a LSN corresponding to a first entry of the write log to be considered for draining, or to be included in a checkpoint. Draining of the write log and creation of checkpoints, both of which are discussed below, may not consider entries beyond the flushed LSN. A flushing LSN is an LSN corresponding to a target entry for flushing. An end LSN is an LSN corresponding to a logical end of the write log.

Figure 10:
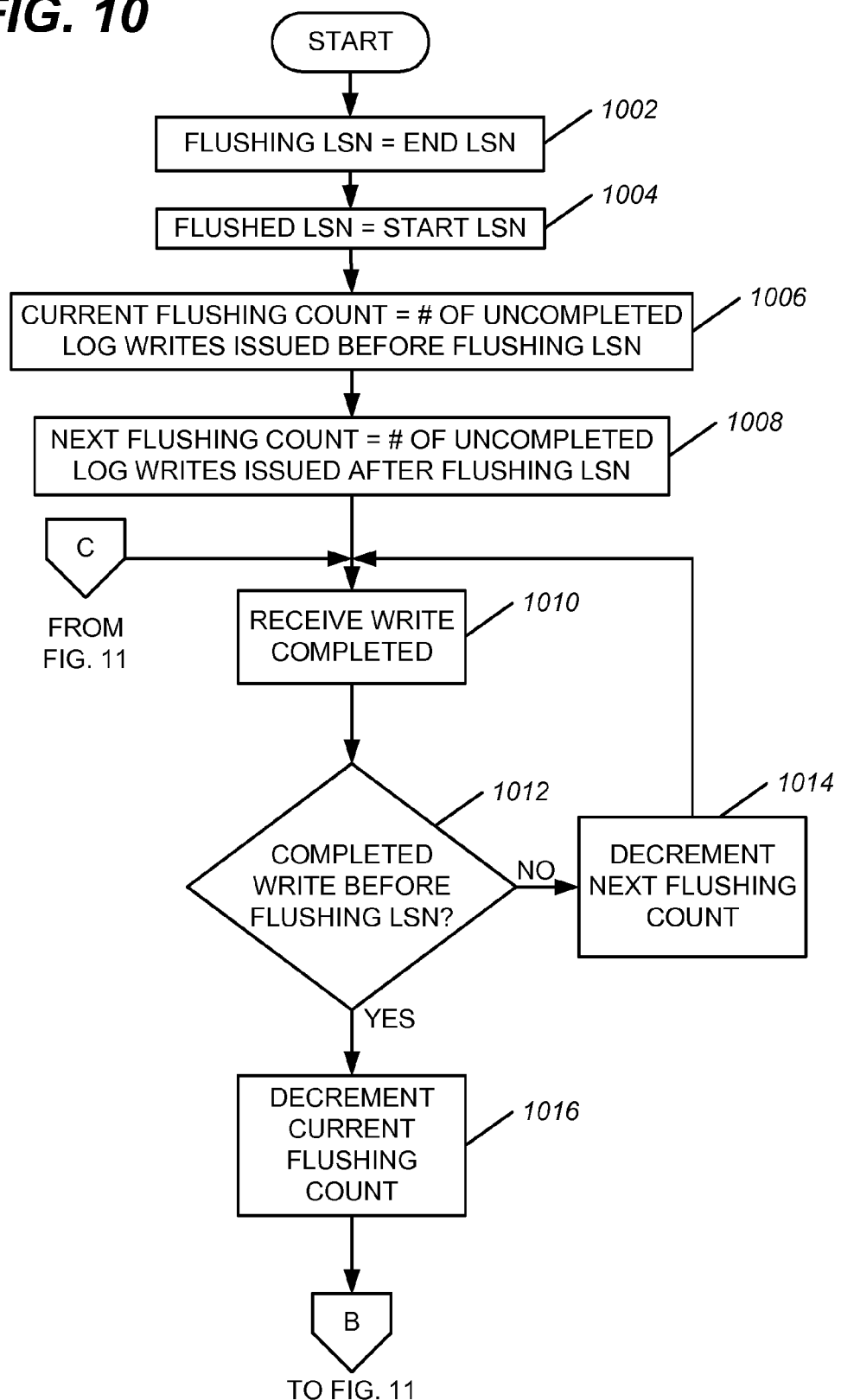
FIGS. 10 and 11 are flowcharts illustrating an exemplary process for keeping track of flushed entries of the write log.
Figure 11:
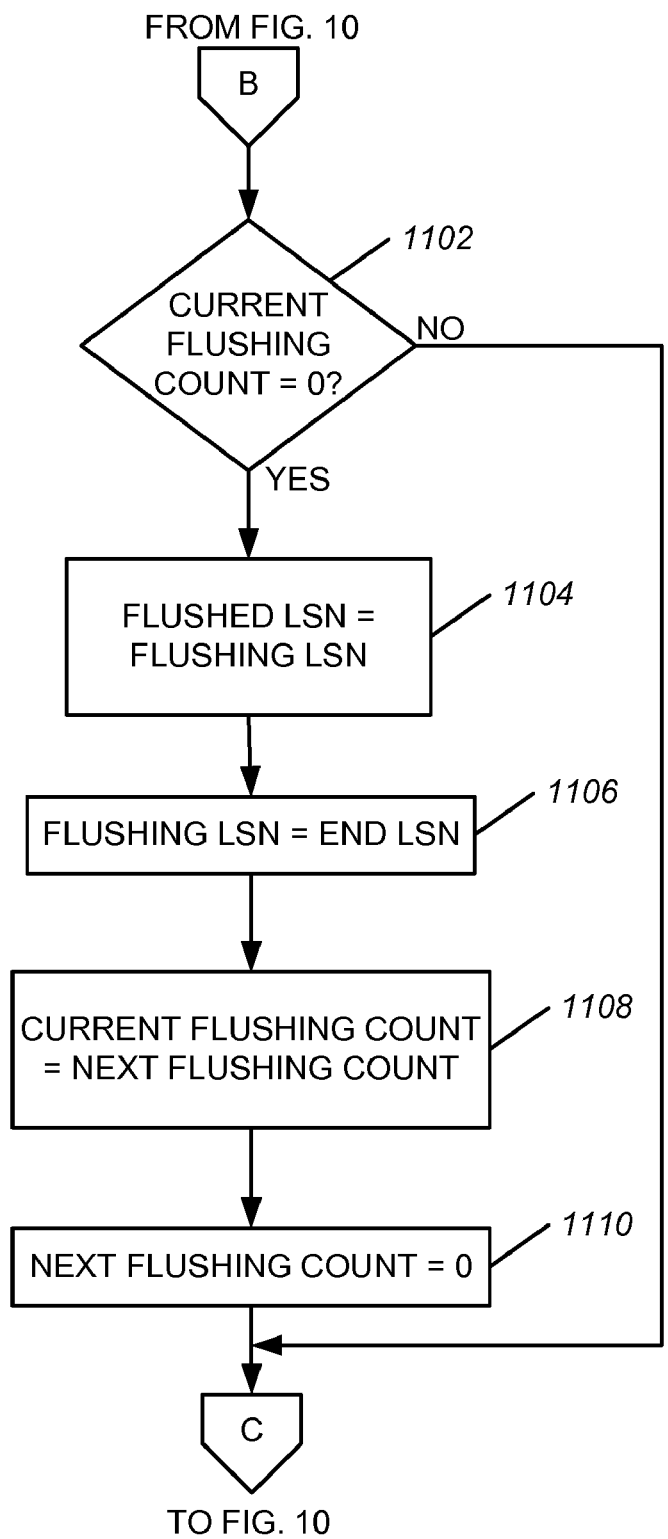

FIGS. 10 and 11 are flowcharts illustrating an exemplary process for keeping track of a flushed LSN in a write log. The process may begin with the processing device initializing flushing LSN to end LSN (act 1002) and flushed LSN to start LSN (act 1004) before any writes to the log occurs. A current flushing count may be a number of uncompleted writes to the write log issued before flushing LSN. Current flushing count may be initialized to zero (act 1006). Next flushing count may be a number of uncompleted writes to the write log issued after flushing LSN. Next flushing count may be initialized to zero (act 1008).

Next, a write complete may be received with respect to a write to the write log (act 1010). The processing device may determine whether the write complete is for a write log entry before flushing LSN (act 1012). If not, then the processing device may decrement next flushing count, which may indicate a number of pending writes with respect to entries after flushing LSN (act 1014). The processing device may then repeat acts 1010-1012.

If, during act 1012, the processing device determines that the write complete is for a write log entry preceding the entry corresponding to flushing LSN, then the processing device may decrement current flushing count (act 1016).

The processing device may then determine whether current flushing count equals zero, indicating that all write log entries preceding the entry corresponding to flushing LSN are completed (act 1102; FIG. 11). If current flushing count equals zero, then the processing device may set flushed LSN to flushing LSN (act 1104). The processing device may then set flushing LSN to be equal to end LSN (act 1106). Alternatively, the processing device may set flushing LSN to be equal to an LSN other than end LSN, such as, for example, an LSN corresponding to an entry that is no more than a predetermined number of entries after flushed LSN. The processing device may then set current flushing count to be equal to next flushing count (act 1108). Next flushing count may then be set to zero (act 1110). Alternatively, if flushing LSN is set to a LSN other than end LSN, then next flushing count may be set to a value indicating a number of pending writes for entries preceding an entry corresponding to flushing LSN. The processing device may again perform act 1010 (FIG. 10).

Figure 12:
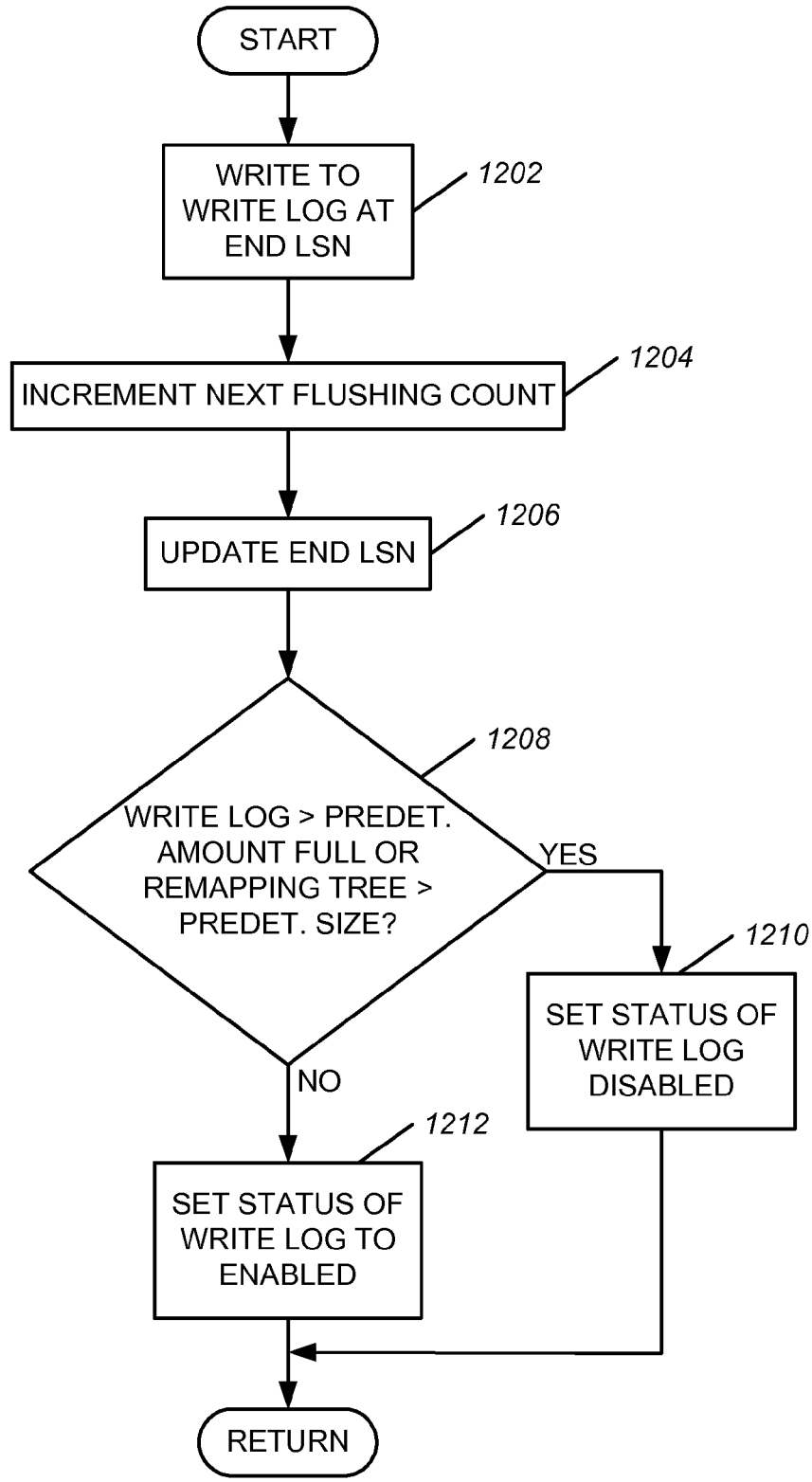
FIG. 12 is a flowchart of an exemplary process for writing to a write log and changing a status of the write log based on how full the write log becomes.

FIG. 12 is a flowchart of an exemplary process for writing to a write log. The process may begin with a processing device issuing a write request to write to the write log at an entry corresponding to end LSN (act 1202). Next, flushing count may be incremented (act 1204) and end LSN may be updated (act 1206). The processing device may then determine whether the write log is greater than a predetermined amount full or whether the remapping tree is larger than a predetermined size (act 1208). If so, then a status of the write log may be set to disabled (act 1210). If the write log is not greater than the predetermined amount full, then the status of the write log may be set to enabled, such that entries, including invalidation records as well as other types of entries, may be added to the write log (act 1212).

Figure 13:
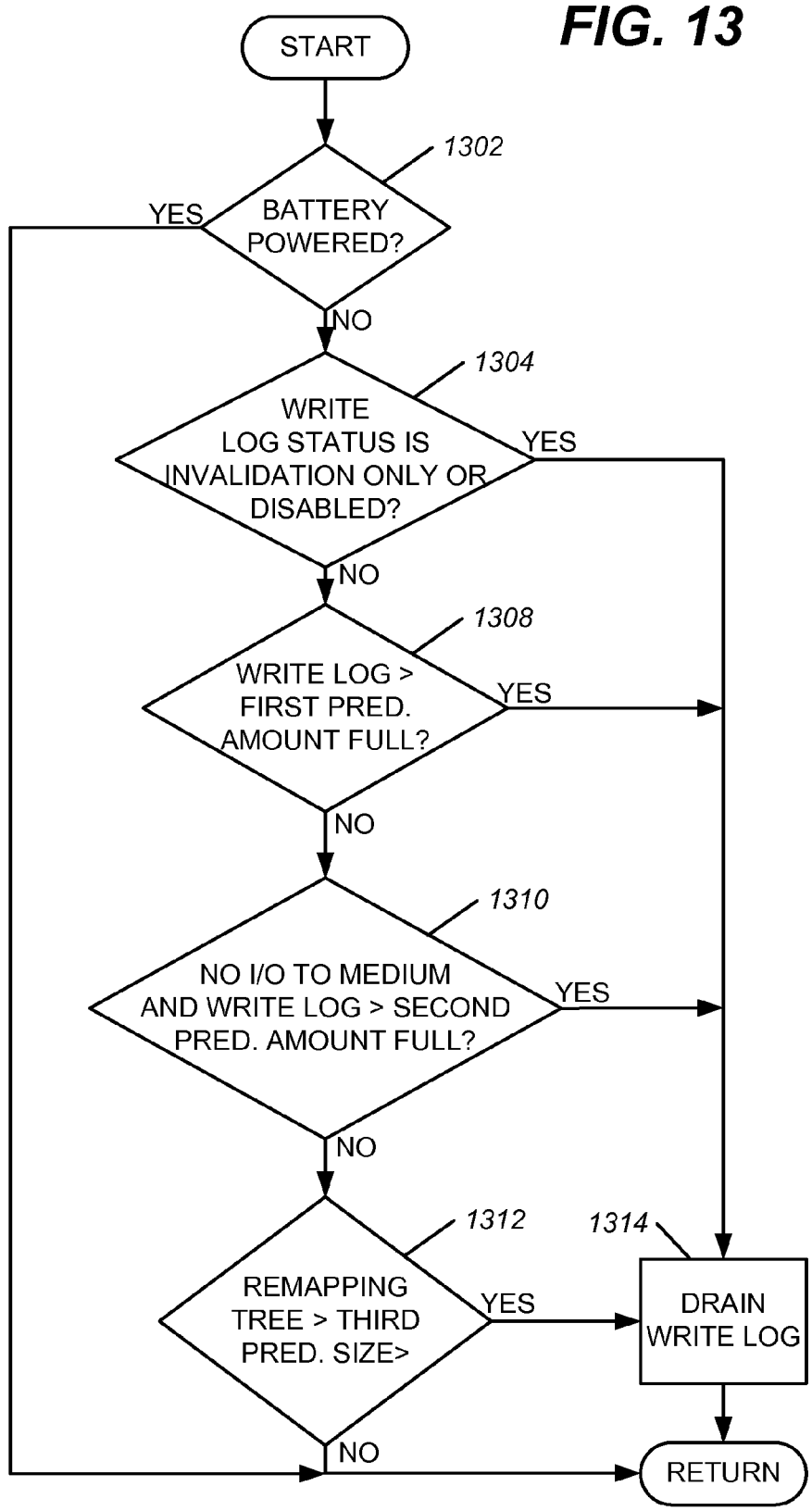
FIG. 13 is a flowchart of an exemplary process for determining whether to drain the write log.

FIG. 13 is a flowchart illustrating an exemplary process for starting draining of the write log. The process may begin with the processing device determining whether the processing device is running on battery power (act 1302). If so, in order to save power, draining may not be performed and the process may be completed.

If, during act 1302, the processing device determines that the processing device is not running on battery power, then the processing device may determine whether a status of the write log is invalidation only or disabled (act 1304). If the status of the write log is invalidation only or is disabled, then the processing device may drain the write log to intended destinations of a random access medium (act 1314).

If, during act 1304, the processing device determines that the status of the write log is not invalidation only and is not disabled, then the processing device may determine whether the write log is more than a first predetermined amount full (act 1308). In some embodiments, the first predetermined amount full may be 67% full. In other embodiments, the first predetermined amount full may be another suitable value. If the write log is more than a first predetermined amount full, then the processing device may drain the write log (act 1314).

If the write log is not more than the first predetermined amount full, then the processing device may determine whether there is no input/output with respect to the random access medium and the write log is greater than a second predetermined amount full, such that the second predetermined amount full is a less than the first predetermined amount full (act 1310). If the processing device determines that there is no input/output with respect to the random access medium and the write log is greater than the second predetermined amount full, then the processing device may drain the write log (act 1314).

If the processing device determines that there is input/output activity with respect to the random access medium or the write log is not greater than the second predetermined amount full, then the processing device may determine whether a remapping tree is larger than a third predetermined size (act 1312). If the remapping tree is larger than the third predetermined size, then the processing device may drain the write log (act 1314).

Figure 14:
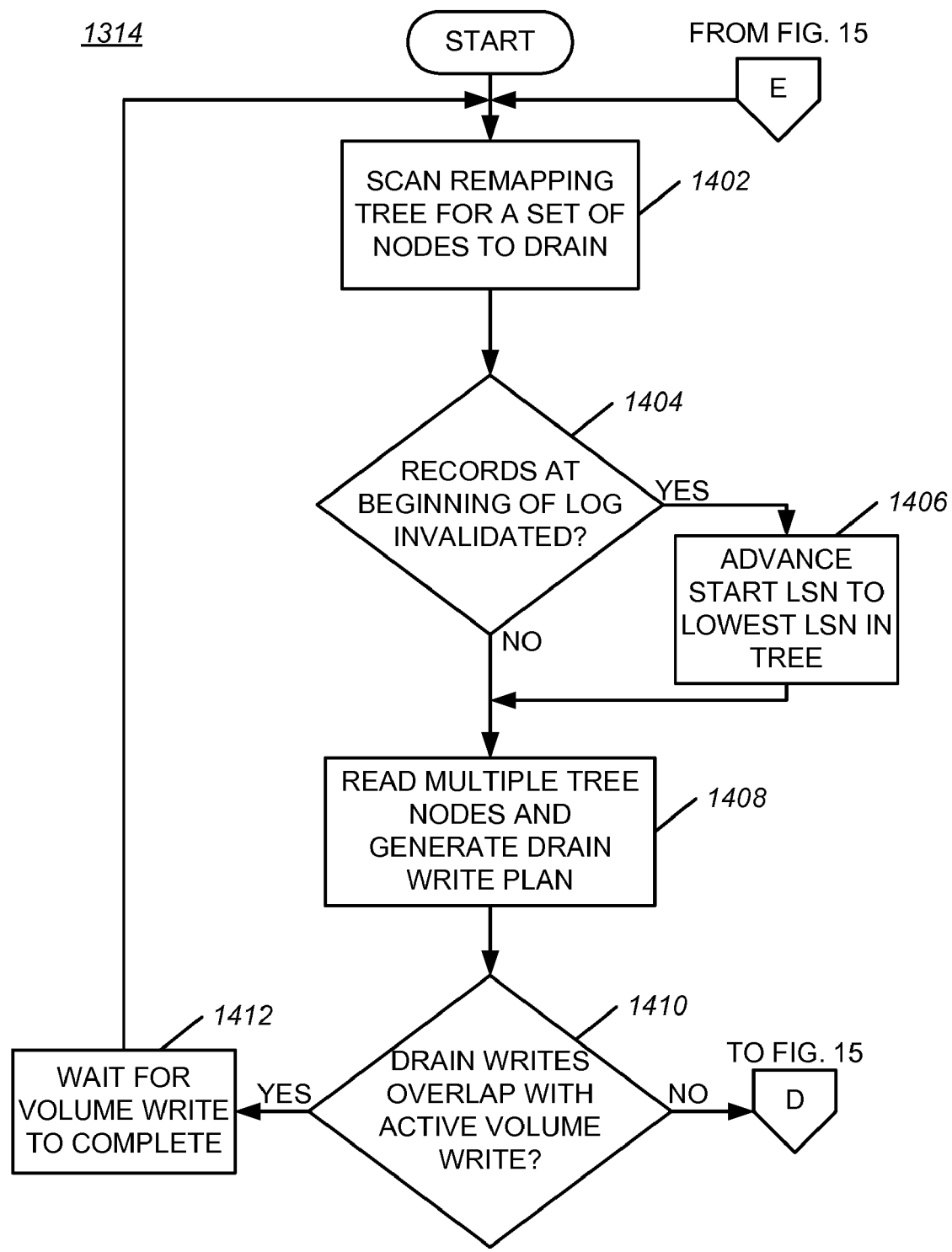
FIGS. 14-16 are flowcharts of an exemplary process for generating a drain write plan for efficiently draining the write log to a random-access medium.
Figure 15:
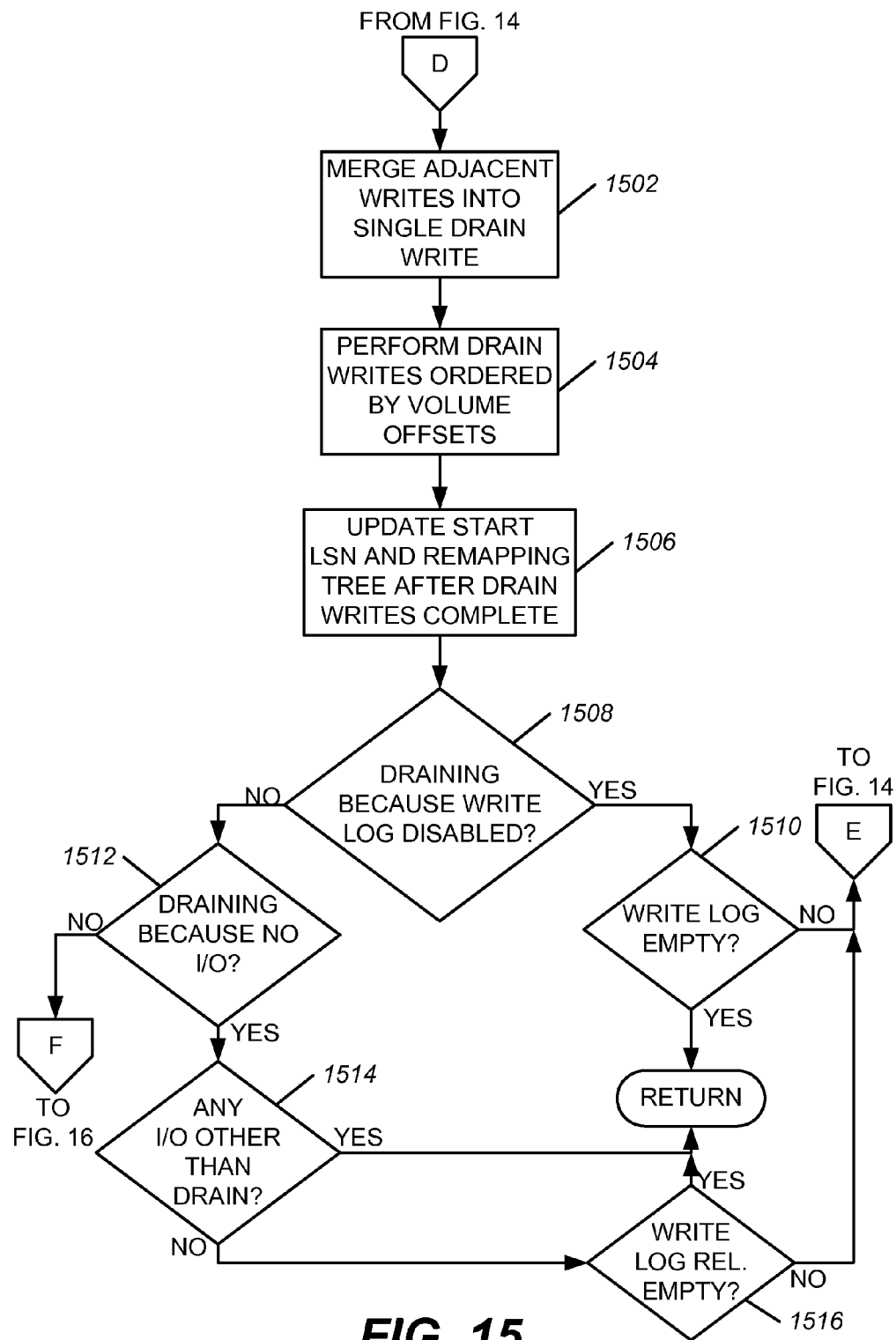
Figure 16:
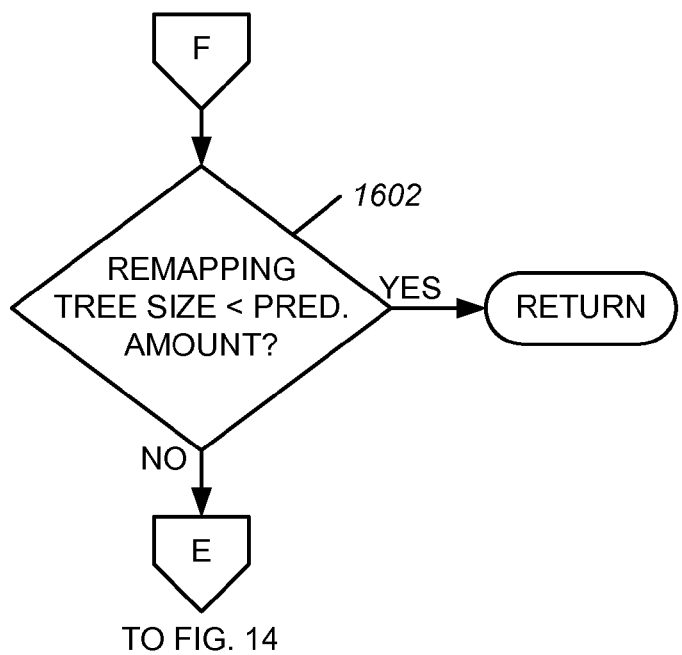

FIGS. 14-16 are flowcharts illustrating an exemplary process for draining the write log, in embodiments consistent with the subject matter of this disclosure. The process may begin with the processing device scanning a remapping tree for a set of nodes, corresponding to entries of the write log, to drain (act 1402). The processing device may then determine whether records at a beginning of the write log have been invalidated (act 1404). If records at the beginning of the write log have been invalidated, then the processing device may advance start LSN to a lowest LSN in the remapping tree that is not invalidated (act 1406).

The processing device may then read multiple nodes of the remapping tree (for example, 20 nodes or another suitable number of nodes) and may generate a drain write plan (act 1408). Only entries of the write log corresponding to LSNs preceding the flushed LSN may be drained. The processing device may then determine whether the drain writes overlap with an active volume write (act 1410). The drain writes overlap with the active volume write when the drain writes and the active volume write are to at least one same LBA of the random access medium. When an overlap is detected, the processing device may wait for the volume write to complete (act 1412) and the processing device may begin the process again by re-performing act 1402.

If, during act 1410, the processing device determines that the drain writes do not overlap with the active volume write, then the processing device may merge adjacent drain writes into a single drain write to reduce inputs and outputs with respect to the random access medium (act 1502; FIG. 15). The processing device may then perform the drain writes in order by volume offsets to minimize seek time (act 1504). After the drain writes complete, the processing device may update start LSN and the remapping tree (act 1506).

Next, the processing device may determine if the draining occurred because the write log was being disabled (act 1508). If so, then the processing device may determine whether the write log is empty (act 1510). If the write log is empty, then the process may be completed. Otherwise, the processing device may again perform act 1402.

If, during act 1508, the processing device determines that draining did not occur because the write log was being disabled, then the processing device may determine whether draining occurred because of no input/output activity with respect to the random access medium (act 1512). If so, the processing device may determine whether there was any input/output activity with respect to the random access medium other than activity related to draining of the write log (act 1514). If so, then the process may be completed. Otherwise, the processing device may determine whether the write log is relatively empty (act 1516). The write log may be determined to be relatively empty when the write log is less than a predetermined amount full, such as, for example, 10% or another suitable value.

If, during act 1516, the processing device determines that the write log is not relatively empty, then the processing device may again perform act 1402 (FIG. 14).

If, during act 1512, the processing device determines that draining is not occurring because of no input/output activity with respect to the random access medium, then the processing device may determine whether a remapping tree size is less than a predetermined amount (act 1602; FIG. 16). If so, the process may be completed. Otherwise, the processing device may again perform act 1402 (FIG. 14).

Figure 17:
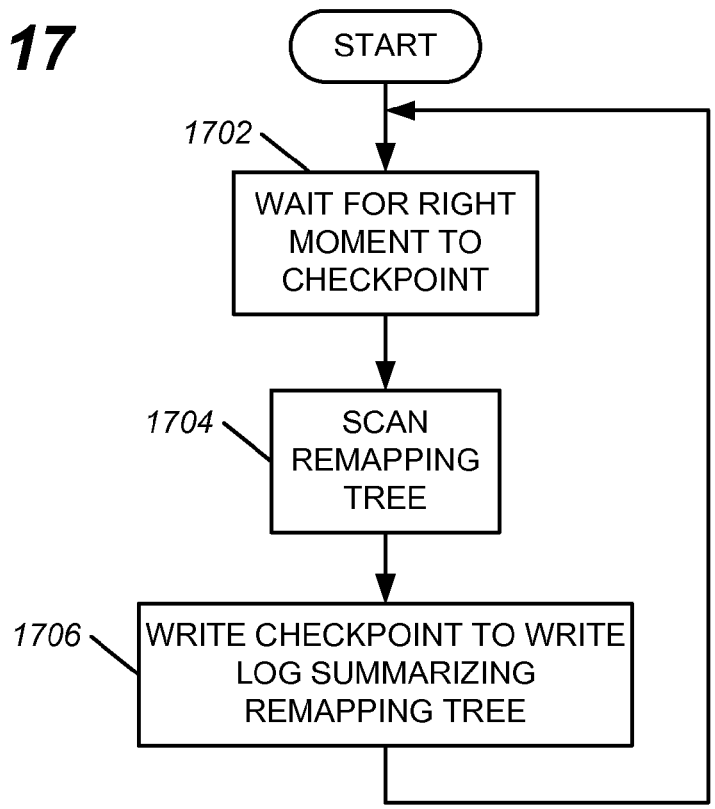
FIG. 17 is a flowchart of an exemplary process for writing a checkpoint to the write log at regular time periods.

FIG. 17 is a flowchart of an exemplary process for writing a checkpoint to the write log. The checkpoint may include information describing all entries of the write log at time intervals. A full checkpoint may be large. Writing a large amount of data may slow down the processing device and may negatively impact a user's experience during the writing of the checkpoint. In some embodiments, a full checkpoint may be divided into a set of smaller incremental checkpoints. Each of the incremental checkpoints may point to a previous incremental checkpoint. Traversing previous incremental checkpoints may, in effect, provide information corresponding to a full checkpoint. The traversing of previous checkpoints terminates at a write log entry corresponding to Start LSN because no write log entries exist before the write log entry corresponding to Start LSN. A full checkpoint may be equivalent to an incremental checkpoint with only one node in a linked list of checkpoints. In a following context, checkpoint refers to an incremental checkpoint because a full checkpoint may be viewed as a special case of an incremental checkpoint.

The process may begin with the processing device waiting for a right moment to write a checkpoint to the write log describing a log range after a previous checkpoint yet before a flushed LSN (act 1702). For example, the right moment may be decided based on write log space not checkpointed since the previous checkpoint, whether a shutdown is initiated, bad sectors exist in non-checkpointed write log space, or other conditions. Next, the processing device may scan a remapping tree, which maps LBAs of a volume of a random access medium to entries in the write log (act 1704). The processing device may then create a checkpoint summarizing the remapping tree, may write the checkpoint to an entry of the write log corresponding to the end LSN, and may update the end LSN (act 1706). The processing device may then repeat acts 1702-1706. Note that only information regarding entries of the write log before the flushed LSN may be recorded in a checkpoint.

Figure 18:
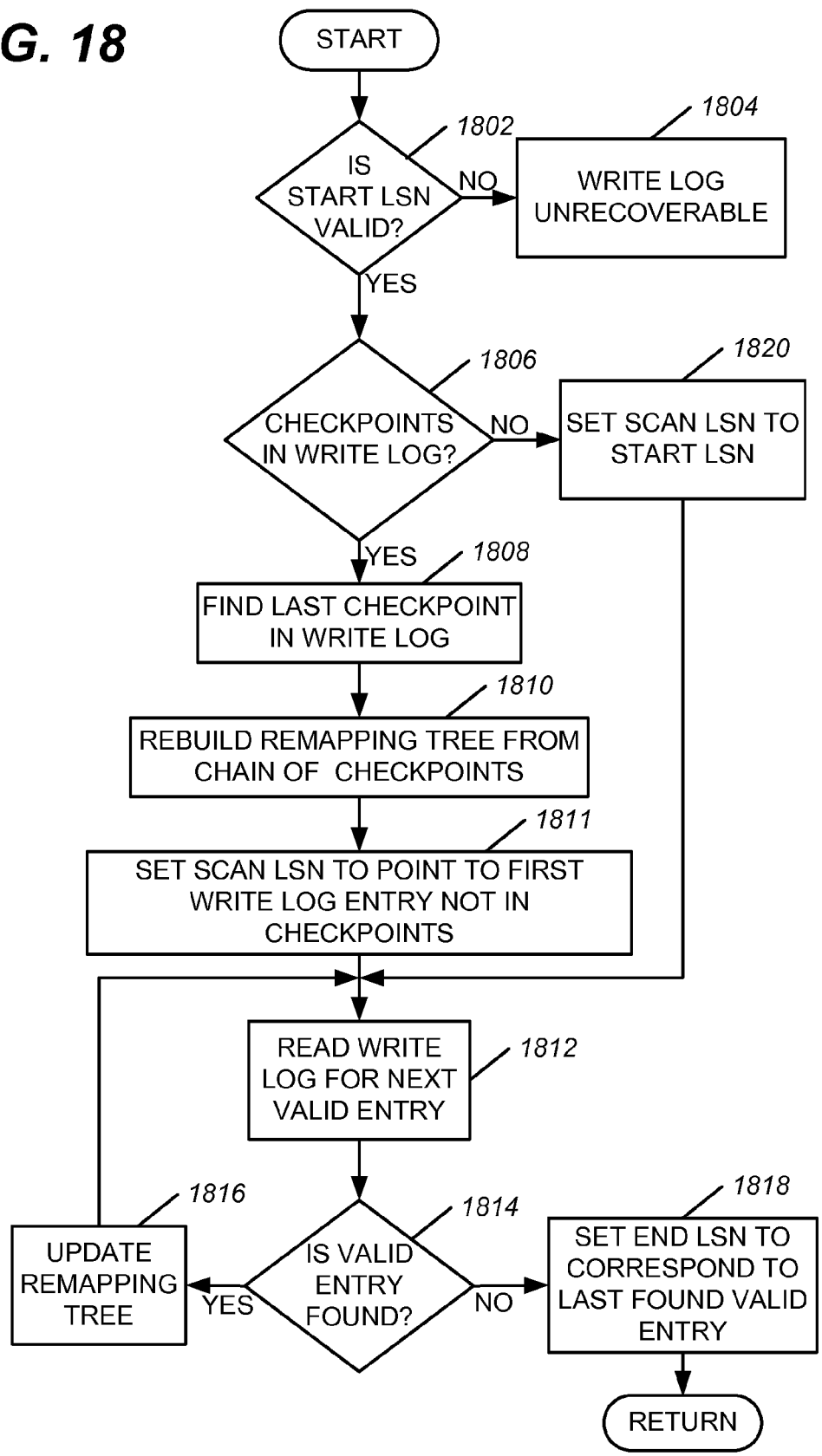
FIG. 18 is a flowchart of an exemplary process for recovering the write log after a dirty shutdown.

A dirty shutdown may be an unexpected shutdown or system crash. FIG. 18 is a flowchart illustrating an exemplary process for recovering from a dirty shutdown. In some embodiments, a normal shutdown may be treated in a same manner as a dirty shutdown, except that a checkpoint may be written before a normal system shutdown to minimize an amount of log space to scan after a reboot.

The process may begin with the processing device obtaining a start LSN from either a first control area or a second control area of a write log and determining whether the start LSN is valid (act 1802). The processing device may determine whether the start LSN is valid by reading a write log entry corresponding to the start LSN and determining whether a checksum for the write log entry is valid, by checking another field of the write log entry for an expected value or a predictable value, or by other methods. If the start LSN is determined not to be valid, then the write log may be considered unrecoverable and a notification to that effect may be provided (act 1804).

If the start LSN is determined to be valid, then the processing device may determine whether any checkpoints exist in the write log (act 1806). In some embodiments, a pointer to a last checkpoint may be stored in the first control area and the second control area of the write log. In such embodiments, the pointer may be obtained and the last checkpoint of a chain of checkpoints may be read and validated. In other embodiments, the processing device may scan the write log, beginning at an entry corresponding to the start LSN, to search for checkpoint entries, until no other valid entries of the write log may be found.

If at least one checkpoint exists in the write log, then the processing device may find a last checkpoint of the chain of checkpoints in the write log (act 1808). The processing device may then rebuild a remapping tree based on the chain of checkpoints by traversing all the checkpoints until a write log entry corresponding to Start LSN is hit. (act 1810). Scan LSN may then be set to correspond to a first write log entry not described by any of the checkpoints (act 1811).

If, during act 1806, the processing device determines that no checkpoints exist in the write log, then the processing device may set Scan LSN to Start LSN (act 1820). After performing act 1810 or act 1820, the processing device may then read a next valid entry after corresponding to the scan LSN (act 1812). In some embodiments, one or more invalid entries of the write log may exist between valid entries of the write log. The processing device may then determine whether a valid entry was found (act 1814). If a valid entry was found, then the processing device may update the remapping tree (act 1816) and may again perform acts 1812-1814. If, during act 1814, the processing device determines that a valid entry of the write log was not found, then the processing device may set end LSN to correspond to the last found valid entry of the write log (act 1818). The process may then be completed.

CONCLUSION

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims.

Although the above descriptions may contain specific details, they are not be construed as limiting the claims in any way. Other configurations of the described embodiments are part of the scope of this disclosure. Further, implementations consistent with the subject matter of this disclosure may have more or fewer acts than as described with respect to FIGS. 7, 8 and 10-18, or may implement acts in a different order than as shown. Accordingly, the appended claims and their legal equivalents define the invention, rather than any specific examples given.

We claim as our invention:

1. A machine-implemented method for sequentially aggregating a data set in a write log in a flash-based storage, the machine-implemented method comprising:

determining whether the data set is suitable for the sequential aggregating in the write log in the flash-based storage;

sequentially writing the data set to the write log in the flash-based storage, instead of writing to an intended destination of a random access medium, when the data set is determined to be suitable for the sequential aggregating, the random access medium being either the flash-based storage or a disk;

maintaining a remapping tree for mapping entries in the write log to logical block addresses in a volume of the random access medium;

draining entries of the write log to respective intended destinations of the random access medium upon detection of any one of a plurality of conditions, the plurality of conditions including: a disabling of the write log; an absence of input/output activity with respect to the random access medium and the write log being more than a first predetermined amount full; the write log being at least a second predetermined amount full regardless of the input/output activity with respect to the random access medium, the second predetermined amount being larger than the first predetermined amount; and the remapping tree being larger than a third predetermined size.

2. The machine-implemented method of claim 1, wherein the determining of whether the data set is suitable for the sequential aggregating in the write log further comprises:

determining whether the data set is less than a predetermined size, and determining that the data set is suitable for the sequential aggregating in the write log when the data set is determined to be less than the predetermined size.

3. The machine-implemented method of claim 1, further comprising:

writing a respective full checkpoint or a respective incremental checkpoint to the write log at certain times, each of the respective full checkpoints or each of the respective incremental checkpoints including information describing contents of the write log.

4. The machine-implemented method of claim 1, further comprising:

recovering the write log after a dirty shutdown, the recovering further comprising:

determining whether at least one checkpoint is included in the write log, each of the at least one checkpoint including information describing contents of the write log, finding a last checkpoint in the write log when the at least one checkpoint is determined to be included in the write log, rebuilding the remapping tree based, at least partly, on the last checkpoint, reading from an entry of the write log, corresponding to a first entry of the write log not having corresponding information included in any checkpoint, until no additional valid entries of the write log are found, updating the remapping tree when a valid entry of the write log is found, and setting an end log sequence number of the write log based on a last found valid entry of the write log.

5. The machine-implemented method of claim 4, wherein when the determining of whether at least one checkpoint is included in the write log determines that no checkpoint is included in the write log, the recovering of the write log further comprises:

reading the write log, beginning from a start of the write log, until no additional valid entries of the write log are found, and updating the remapping tree based on found valid entries of the write log.

6. The machine-implemented method of claim 1, further comprising:

writing an invalidation record to at least one entry of the write log indicating that the at least one entry of the write log is invalid, wherein invalidated entries of the write log are not drained to respective intended destinations on the random access medium.

7. The machine-implemented method of claim 1, wherein the random access medium is the flash-based storage.

8. A system for sequentially aggregating a data set in a write log residing on a flash-based storage, the system comprising:

at least one processor; and a memory connected to the at least one processor, the memory further comprising:

instructions for determining whether a data set is suitable for sequentially writing to the write log in the flash-based storage when a size of the data set is less than a predetermined size, instructions for sequentially writing the data set to the write log, instead of writing to an intended destination on the flash-based storage medium, when the data set is determined to be suitable for the sequential writing, instructions for maintaining a remapping tree for mapping between entries in the write log and logical block addresses in the flash-based storage, and instructions for draining entries of the write log to respective intended destinations on the flash-based storage when an absence of input/output activity with respect to the flash-based storage is detected and the write log is at least a predetermined amount full.

9. The system of claim 8, wherein the memory further comprises:

instructions for writing an invalidation record to the write log indicating that logical block addresses of the flash-based storage are invalid for one or more entries of the write log.

10. The system of claim 9, wherein the memory further comprises:

instructions for draining only non-invalidated ones of the entries of the write log to the respective intended destinations on the flash-based.

11. The system of claim 8, wherein the remapping tree is an avl tree.

12. The system of claim 8, wherein the memory further comprises:

instructions for writing a respective full checkpoint or a respective incremental checkpoint to the write log at time intervals, each one of respective full checkpoints or the respective incremental checkpoints including information describing contents of the write log at a time the one of the respective full checkpoints or the respective incremental checkpoints was written.

13. The system of claim 8, wherein the memory further comprises:
  instructions for determining, after a dirty shutdown, whether at least one checkpoint is included in the write log,
  instructions for finding a last checkpoint in the write log when at least one checkpoint is determined to be included in the write log,
  instructions for rebuilding the remapping tree based, at least partly, on the last checkpoint,
  instructions for reading from an entry of the write log, corresponding to a first entry of the write log not having information included in any checkpoint, until no additional valid entries of the write log are found, and
  instructions for updating the remapping tree after a valid entry of the write log is found.

14. A tangible machine-readable medium having instructions recorded thereon for at least one processor, the instructions comprising:
  instructions for determining whether data intended to be written to a flash-based storage device is suitable for being sequentially written to a write log included within a volume of the flash-based storage device;
  instructions for sequentially writing the data to the write log when the data is determined to be suitable for being sequentially written to the write log;
  instructions for maintaining a remapping tree for mapping between entries in the write log and logical block addresses of the flash-based storage device; and
  instructions for draining entries of the write log to respective intended destinations on the flash-based storage device upon detection of at least one of a plurality of conditions, the plurality of conditions comprising, as one of the plurality of conditions, the remapping tree being larger than a predetermined size.

15. The tangible machine-readable medium of claim 14, wherein the plurality of conditions further comprise:
  a disabling of the write log,
  an absence of input/output activity with respect to the flash-based storage device and the write log being more than a second predetermined amount full, and
  the write log being at least a third predetermined amount full regardless of the input/output activity with respect to the flash-based storage device, the third predetermined amount being larger than the second predetermined amount.

16. The tangible machine-readable medium of claim 14, wherein the instructions further comprise:
  instructions for writing a checkpoint to the write log, contents of the checkpoint describing contents of the write log.

17. The tangible machine-readable medium of claim 16, wherein the instructions further comprise:
  instructions for recovering the remapping tree, after a shutdown, based, at least partially, on the checkpoint.

18. The tangible machine-readable medium of claim 17, wherein the instructions for recovering the remapping tree further comprise:
  instructions for reading the write log, starting from an entry of the write log corresponding to a first entry of the write log not having corresponding information included in the checkpoint, for a next valid entry of the write log, and
  instructions for updating the remapping tree based on the next valid entry of the write log.

19. The tangible machine-readable medium of claim 14, wherein the instructions further comprise:
  instructions for writing an invalidation record to the write log indicating that logical block addresses of the flash-based storage device, corresponding to at least one entry of the write log, are invalid, and
  instructions for not draining, to intended destinations on the flash-based storage device, invalidated entries of the write log.

20. The tangible machine-readable medium of claim 14, further comprising:
  instructions for determining whether the data intended to be written to the flash based storage device is included in a stream; and
  instructions for determining that the data is not suitable to be written to the write log when the data is determined to be in the stream.

* * * * *